United States Patent
Domeij

(10) Patent No.: US 8,378,390 B2
(45) Date of Patent: Feb. 19, 2013

(54) SILICON CARBIDE BIPOLAR JUNCTION TRANSISTOR (BJT) HAVING A SURFACE ELECTRODE DISPOSED ON TOP OF A DIELECTRIC LAYER FORMED AT A REGION BETWEEN EMITTER CONTACT AND BASE CONTACT

(75) Inventor: Martin Domeij, Sollentuna (SE)

(73) Assignee: Fairchild Semiconductor Corporation, San Jose, CA (US)

( * ) Notice: Subject to any disclaimer, the term of this patent is extended or adjusted under 35 U.S.C. 154(b) by 0 days.

(21) Appl. No.: 13/243,056

(22) Filed: Sep. 23, 2011

(65) Prior Publication Data

US 2012/0007103 A1 Jan. 12, 2012

Related U.S. Application Data

(63) Continuation of application No. PCT/SE2010/050310, filed on Mar. 22, 2010.

(60) Provisional application No. 61/162,721, filed on Mar. 24, 2009.

(51) Int. Cl.
*H01L 29/737* (2006.01)

(52) U.S. Cl. .... 257/197; 257/77; 257/586; 257/E29.174

(58) Field of Classification Search .................. 257/77, 257/197, 565, 593, 586
See application file for complete search history.

(56) References Cited

U.S. PATENT DOCUMENTS

| 4,945,394 A | 7/1990 | Palmour et al. |
| 2009/0057685 A1 | 3/2009 | Mochizuki et al. |
| 2010/0001290 A1 | 1/2010 | Nonaka |

FOREIGN PATENT DOCUMENTS

| EP | 1806787 A1 | 11/2007 |
| WO | 2006135031 A1 | 12/2006 |

OTHER PUBLICATIONS

Office Action received for Swedish Patent Application No. 1150386-9, mailed on Nov. 25, 2011, 4 pages, (English Translation Only).
Office Action received for Swedish Patent Application No. 0950185-9, mailed on Sep. 25, 2009, 4 pages, (English Translation Only).
International Preliminary Report on Patentability received for PCT Patent Application No. PCT/SE2010/050310, mailed on Sep. 27, 2011, 6 pages.
International Search Report received for PCT Patent Application No. PCT/SE2010/050310, mailed on Jun. 30, 2010, 5 pages.
Lee, H.-S. et al., "Surface Passivation Oxide Effects on the Current Gain of 4H-SiC bipolar junction transistors", Applied Physics Letters, 92, 082113 (2008).

*Primary Examiner* — Anh Mai

(57) ABSTRACT

The present disclosure relates to a silicon carbide (SiC) bipolar junction transistor (BJT), where the surface region between the emitter and base contacts (1, 2) on the transistor is given a negative electric surface potential with respect to the potential in the bulk SiC. The present disclosure also relates to a method for increasing the current gain in a silicon carbide (SiC) bipolar junction transistor (BJT) by the reduction of the surface recombination at the SiC surface between the emitter and base contacts (1, 2) of the transistor.

21 Claims, 2 Drawing Sheets

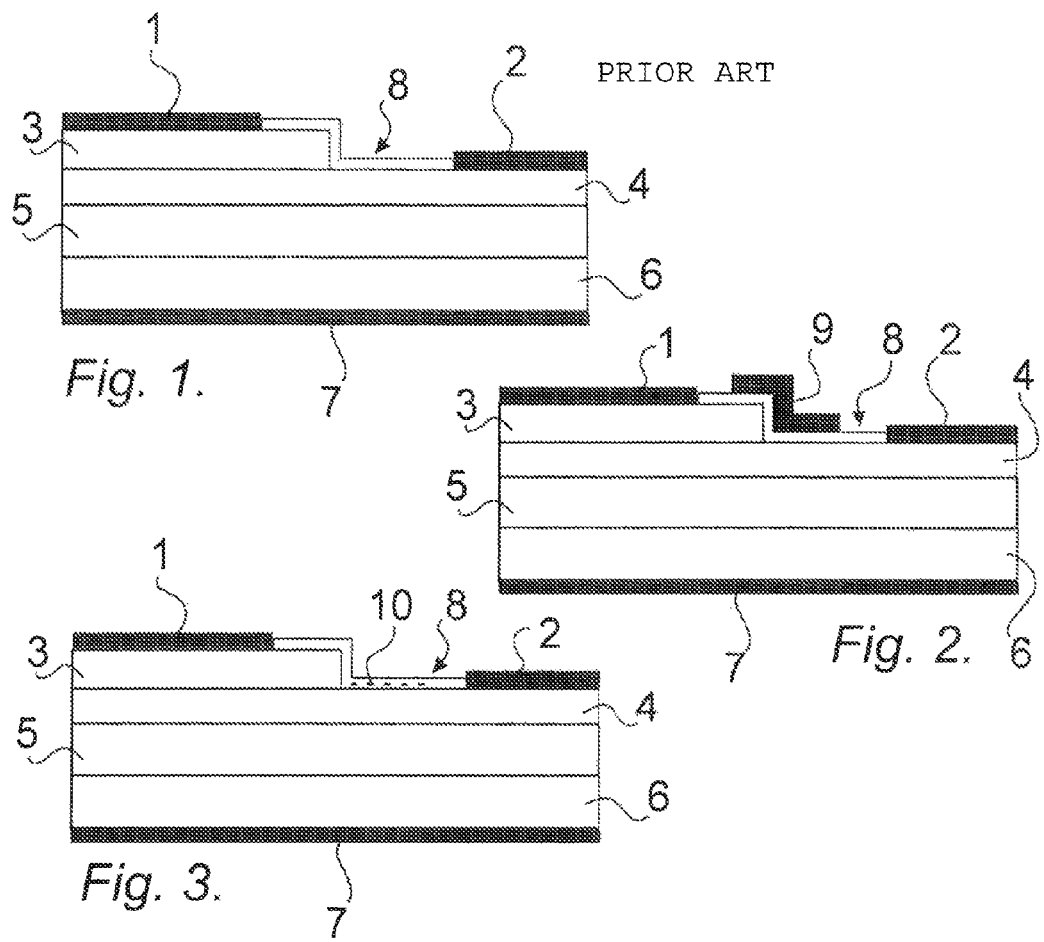
Fig. 1. PRIOR ART
Fig. 2.
Fig. 3.
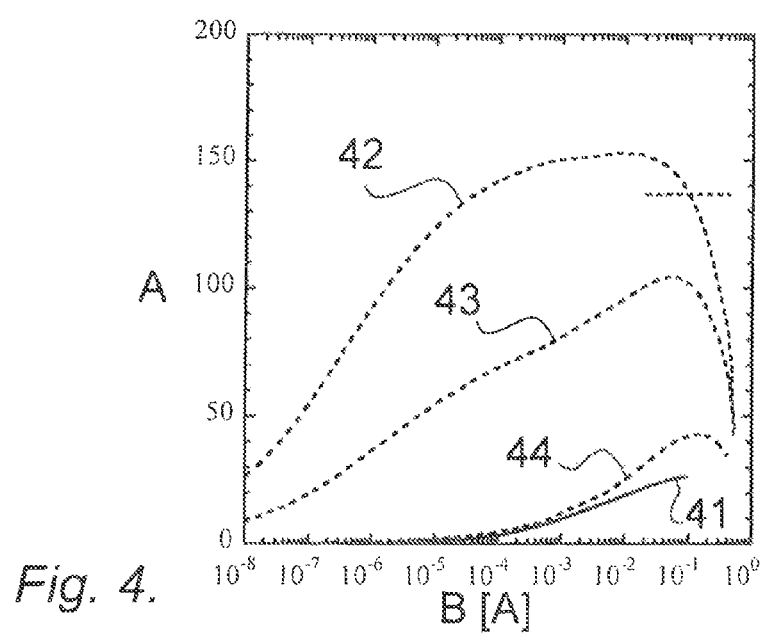
Fig. 4.

SILICON CARBIDE BIPOLAR JUNCTION TRANSISTOR (BJT) HAVING A SURFACE ELECTRODE DISPOSED ON TOP OF A DIELECTRIC LAYER FORMED AT A REGION BETWEEN EMITTER CONTACT AND BASE CONTACT

CROSS-REFERENCE TO RELATED APPLICATIONS

This application is a continuation under 35 U.S.C. §§111 (a) and 120 of PCT Patent Application No. PCT/SE2010/050310, filed Mar. 22, 2010, entitled "SILICON CARBIDE BIPOLAR JUNCTION TRANSISTOR," which claims priority to and the benefit of U.S. Provisional Application No. 61/162,721, filed on Mar. 24, 2009, and claims priority to and the benefit of Swedish Application No. 0950185-9, filed on Mar. 24, 2009. All three of these patent applications are incorporated by reference herein in their entireties.

TECHNICAL FIELD

The subject matter of the present disclosure relates to a silicon carbide bipolar junction transistor for high current gain and a method for increasing the current gain in a silicon carbide bipolar junction transistor.

BACKGROUND

Power transistors are used as switches in power electronic systems. The switches alternate between conducting a high current in the on-state, and blocking a high voltage in the off-state. Two of the most important figures of merit for power switches are low power losses during forward conduction and low power losses during switching between on and off. Low power losses are beneficial because they enable energy savings, and because more compact systems can be constructed as the heat dissipation cause by the power losses is reduced.

Silicon carbide (SiC) bipolar junction transistors (BJTs) have low power losses during conduction and switching and are therefore useful as switches in power electronic systems. Transitional silicon (Si) power transistors such as MOSFETs and Insulated Gate Bipolar Transistors (IGBTs) cannot match the power losses of SiC BJTs for voltage ratings from about 1200 V and above. There are also other SiC power transistors such as MOSFETs and Junction Field Effect Transistors (JFETs) and both of these transistor types have relatively low power losses. The MOSFET has, however, limited oxide reliability and high channel resistance which causes additional power losses during forward conduction. The JFET is a so-called normally-on device, and this is a disadvantage in many power electronic systems, because it is a safety concern if the JFET drive circuit fails.

In Proceedings of the 19th International Symposium on Power Semiconductor Devices and Ics, p. 293-6, 2007, by S. Balachandran et al. it is described that SiC BJTs of the NPN type have been successfully developed and low on-state voltages have been shown for BJTs capable of maximum voltages up to 6 kV.

In IEEE Electron Device Letters, Vol. 26, No. 3, 2005, by S. Krishnaswami et al., it is shown that large areas of SiC BJTs for 30 A and 1000 V have been developed with a current gain of about 40 and a low forward voltage drop of only 0.6 V at a current density of 100 A/cm$^2$.

The best SiC BJTs are fabricated with an epitaxial NPN structure and the base-emitter and base-collector junctions are terminated by dry etching of SiC to form so-called mesa structures. A SiC BJT, with high current capability of several amps, contains many inter-digitated emitter fingers spread over a large area of several mm$^2$. Key factors for obtaining state-of-the-art SiC BJTs with optimum breakdown voltage and low power losses are; an efficient high voltage junction termination, bulk SiC material with low defect concentrations, low-resistive ohmic contacts to both n-type and p-type SiC, and an efficient surface passivation.

SUMMARY

The traditional Si switches used today, MOSFETs and IGBTs, are voltage controlled devices. This means that the controlling gate terminal of the switch needs only a DC voltage in steady-state and the current from the drive circuit is therefore negligible in the on-state and in the off-state. Instead a significant current is needed during switching to charge and discharge the device internal capacitances (between gate-source and between gate-drain). As long as the switching frequency is not very high, the power that can be delivered from the drive circuit is modest and relatively small and cheap integrated circuit can be used as drive circuits for voltage controlled devices like MOSFETs and IGBTs.

A SiC BJT, on the other hand, is a current controlled transistor, and the drive circuit therefore has to deliver a DC current as the BJT is in the on-state. Due to this on-state DC drive current, the drive circuit of a BJT has to deliver significantly higher power than in the case of MOSFETs and IGBTs. With the current gains that are reached today for SiC BJTs (around 20-60), a large area SiC BJT cannot be controlled using small integrated circuit and the drive circuit therefore becomes more expensive and complicated to design. The more powerful and complex drive circuit that is needed is an important drawback of SiC BJTs compared to MOSFETs and IGBTs and to increase the market potential for SiC BJTs it is important to increase the current gain from the current values in the range of 20-60 to values of 100 and above.

Device simulations of SiC BJTs with a blocking capability of 1200 V indicate that a current in the range of 150-200 can be expected if the carrier lifetime of the material is about 100 ns. This value of carrier lifetime agrees reasonably with results from material characterization of epitaxial SiC layers of both n-type and p-type. With state-of-the-art epitaxy, the SiC material quality should therefore be sufficient for fabricating BJTs with current gains in the range of 150-200.

The main current gain limiting factor for state-of-the-art SiC BJTs is surface recombination at the etched termination of the base-emitter junction at and close to the edge of the emitter.

SiC BJTs are often fabricated by epitaxial growth of the NPN bipolar transistor structure followed by etching SiC to terminate the base-emitter and base-collector pn junctions.

FIG. 1 displays a cross-section of the active region of a typical SiC NPN BJT showing the edge of the emitter region, with an emitter contact 1, a base contact 2, an n$^+$ emitter region 3, a p base region 4, an n$^-$ collector region 5, an n$^+$ substrate region 6 and a collector contact 7. A dielectric surface passivation layer 8 is used on top of the SiC, between the base and emitter metal contacts 1, 2. This surface passivation layer 8 is used to terminate the dangling bonds of the atoms on the SiC surface, and thereby reduce the density of defects which cause surface recombination and surface leakage currents.

It is, however, difficult to form a surface passivation layer 8 on a SiC surface and obtain low defect concentrations at the interface between SiC and the surface passivation layer, as shown in FIG. 1. The best results today are obtained by oxidation of SiC using similar methods as when fabricating SiC MOSFET transistors, for example BJTs passivated by oxidation in $N_2O$ ambient, as shown in IEEE Electron Device Letters, Vol. 28, No. 11, 2007, by H-S. Lee et al. or pyrogenic oxidation followed by annealing in hydrogen, as shown in a presentation by Y. Negoro et. al., at the International Conference on Silicon Carbide and Related Materials (IC-SCRM2007), Barcelona, 7-12 Sep. 2008.

One strategy to reduce surface recombination and thereby increase the current gain of SiC BJTs is to develop passivation layers with fewer defects at the interface between SiC and the passivation layer.

With the purpose of solving one or more of the above indicated problems, and from the standpoint of a silicon carbide (SiC) bipolar junction transistor (BJT), the present disclosure presents an alternative solution to the problem of fabricating SiC BJTs with high current gain by controlling the electric surface potential in order to suppress surface recombination.

The present disclosure teaches that the surface region between the emitter and base contacts on said transistor is given a negative electric surface potential with respect to the potential in the bulk SiC.

One possible embodiment is that the transistor comprises a conductive layer, hereby referred to as surface electrode, on top of the dielectric layer which is used as surface passivation.

The surface electrode can consist of an electrically conductive material, such as a metal or a highly doped poly-silicon.

It is further proposed that the surface electrode is provided with a negative electric potential, with respect to the bulk SiC inside the surface, either by connecting it to the emitter contact or by applying an external negative potential with respect to the underlying bulk of the SiC.

It is also possible to provide a negative electric surface potential by allowing the transistor to comprise a negative electric charge at the interface between SiC and the dielectric layer or inside the dielectric layer. The negative charge can for instance consist of negatively charged ions or electrons.

The dielectric layer may consist of silicon dioxide between the surface electrode and the SiC. This dielectric layer may have a thickness in the order of 10 to 30 nanometers (nm), for instance 20 nm.

The present disclosure also includes a method for increasing the current gain in a silicon carbide (SiC) bipolar junction transistor (BJT) by reducing the surface recombination at the SiC surface between the emitter and base contacts of the transistor.

The reduction of the electron concentration in the surface region can be achieved by creating a negative electric surface potential with respect to the potential in the bulk SiC inside the surface.

Another way of achieving the reduction of the electron concentration in the surface region is by creating a negative electric charge at the interface between SiC and the dielectric layer or inside the oxide.

A transistor and a method where a negative surface charge relative to the bulk SiC below the surface has been created according to one or more embodiments has the following advantages as it is used in SiC BJTs.

The current gain becomes higher because surface recombination is suppressed. Increasing the current gain of SiC BJTs is very important because this means that less base current is needed to control the BJT and this means that the drive circuit becomes cheaper and less complicated to construct.

Some embodiments can be combined with other improvements, i.e. if the quality of the surface passivation is improved, then the embodiments will anyway give further improvements.

Some embodiments can be implemented using a fabrication process because metal overlayer contacts can be fabricated and no additional process steps may therefore be needed to produce a surface electrode, as is one proposed embodiment.

The recombination energy of SiC is about 3.2 eV and this energy is large enough to produce electrons with high energy, so-called hot electrons which can be injected into the surface passivation layer and influence long-term stability. In some embodiments, surface recombination can be reduced. Less hot electrons are therefore created and this is expected to improve the long-term reliability.

BRIEF DESCRIPTION OF THE DRAWINGS

A transistor and a method according to several embodiments will now be described in detail with reference to the accompanying drawings.

FIG. 1 is a cross-section of the active region of a SiC BJT showing the dielectric surface passivation layer on top of the SiC layer between the base and emitter contacts according to prior art.

FIG. 2 is a cross-section of the active region of a SiC BJT showing the surface electrode as one embodiment.

FIG. 3 is a cross-section of the active region of a SiC BJT showing a negative charge inside the dielectric surface passivation layer as one embodiment.

FIG. 4 is a graph showing measured and simulated common emitter current gain as function of collector current.

DETAILED DESCRIPTION

Figure 5:
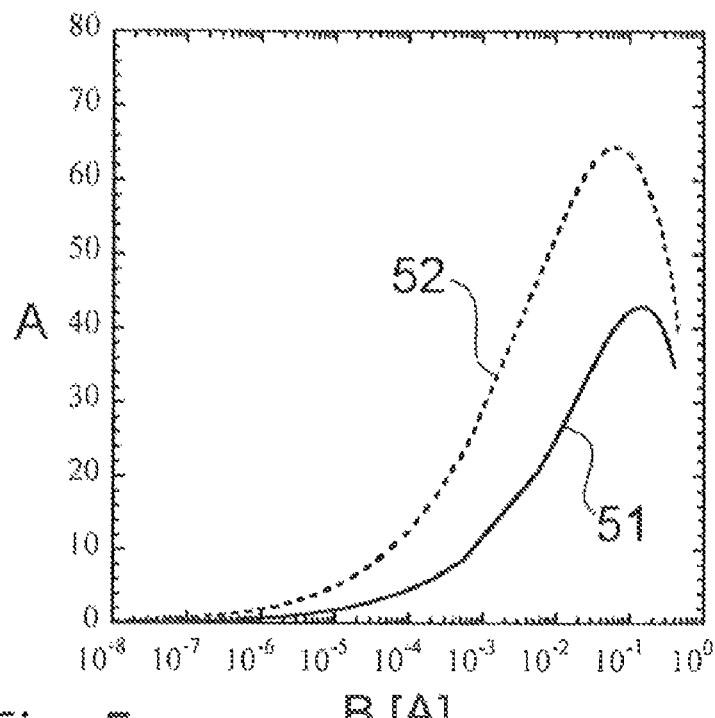
FIG. 5 is a graph showing a device simulations of a SiC BJT for the cases without a surface electrode (as shown in FIG. 2) and with a surface electrode connected to the emitter and base contacts respectively.

In order to increase the current gain of state-of-the-art SiC BJTs the surface recombination at the SiC surface between the emitter and base contacts can be reduced. The amount of surface recombination which takes place can depend on three factors:

1) the defect concentration at the interface between SiC and the surface passivation layer
2) the electron concentration in the surface region
3) the hole concentration in the surface region The factor 1 above is technology dependent but the factors 2 and 3 are possible to influence by design and this can be one of the methods of at least some embodiments.

The recombination rate for electron-hole pairs depends mainly on the concentration of the carrier type (electron or hole) which is in minority since this is the rate limiting free carrier. Surface recombination occurs both in the emitter and in the base region but device simulations show that at least some of the recombination takes place in the p-doped base layer along the surface. In the p-doped base layer, the electrons are in minority and the electron concentration therefore limits the rate of surface recombination. The total surface recombination can therefore be reduced by suppressing the electron concentration in the surface region in the p-doped base.

In some embodiments, the electron concentration in the surface region can be reduced by creating a negative electric surface potential with respect to the potential in the bulk SiC inside the surface. Since electrons are repelled by a negative electric potential, the electron concentration is suppressed by the negative surface potential which is created, and surface recombination is therefore reduced.

In at least one embodiment, a conductive layer can be fabricated, hereby referred to as surface electrode, on top of the dielectric layer which is used as surface passivation. A cross-section of a typical NPN BJT with the surface electrode is shown in FIG. 2, with an emitter contact 1, a base contact 2, an $n^+$ emitter region 3, a p base region 4, an $n^-$ collector region 5, an $n^+$ substrate region 6 and a collector contact 7. The surface electrode 9 can consist of metal, highly doped polysilicon or any other electrically conductive material. A negative electric potential, with respect to the bulk SiC inside the surface, is applied to the surface electrode 9 either by connecting it to the emitter contact 1 or by applying an external negative potential with respect to the underlying bulk of the SiC.

The thickness of the surface passivation layer between the surface electrode and the SiC is an important parameter to optimize for at least some embodiments to work efficiently. A suitable condition for at least some embodiments is to use a dielectric layer with a thickness that is in the order of 10 to 30 nm, consisting of silicon dioxide between the surface electrode and the SiC.

In another embodiment, a negative electric charge 10 can be created at the interface between SiC and the dielectric layer or inside the dielectric surface passivation layer 8, as shown in FIG. 3. FIG. 3 shows that there is no surface electrode and instead of the negative charge 10 is used to obtain a negative surface potential with respect to the bulk SiC. A negative charge can be created in different ways, either by fabricating the dielectric surface passivation layer 8 under conditions that are known to create negative interface charge, or by injecting negatively charged ions or electrons into the dielectric surface passivation layer 8.

Both theoretical and experimental evident will now be presented to show the working principles in at least some of the embodiments. This theoretical and experimental support for the at least some embodiments is essential since the problem of surface recombination in SiC BJTs is two-dimensional and complex to analyze even for those skilled in the art.

FIG. 4 shows a comparison of measured 41 and simulated 42, 43, 44 common emitter current gain A as function of collector current B for a SiC BJT with the collector-base voltage $V_{CB}=0$ V for a small SiC BJT with an emitter width of 10 μm and an emitter length of 500 μm. The measurement 41 shows a peak current gain of about 26.

The simulations have been performed with three different trap densities, where:

$D_{IT}=1·10^{10}$ cm$^{-2}$ eV$^{-1}$ is shown with dotted line 42 in the figure, $D_{IT}=1·10^{11}$ cm$^{-2}$ eV$^{-1}$ is shown with dotted line 43 in the figure, and $D_{IT}=1·10^{12}$ cm$^{-2}$ eV$^{-1}$ is shown with dotted line 44 in the figure.

The capture cross-section at the interface between SiC and the surface passivation layer 8 is $\sigma=10^{14}$ cm$^2$, and in this particular example the surface passivation layer 8 consists of silicon dioxide. The trap densities are assumed to be contact over the SiC bandgap. The traps in the upper half of the bandgap are assumed to be acceptors and the traps in the lower half of the bandgap are assumed to be donors. A bulk carrier lifetime of $\tau=100$ ns was used in the simulations.

FIG. 4 shows reasonable agreement between the measurement 41 and simulation 44 for the trap concentration $D_{IT}=1·10^{12}$ cm$^{-2}$ eV$^{-1}$ including an increase of the current gain with increasing collector current. The results in FIG. 4, using reasonable values to simulate bulk and surface recombination, provide support that surface recombination is limiting the current gain of a typical SiC BJT. The results in FIG. 4 also suggest that the current gain of SiC BJT can be significantly increased by reducing the surface recombination. This can be done either by decreasing the trap concentrations at the interface or by providing a negative surface potential according to at least one embodiment.

FIG. 5 shows device simulation for the same BJT as in FIG. 4 with the trap concentration $1·10^{12}$ cm$^{-2}$ eV$^{-1}$ with and without a potential applied to a surface electrode 9 in the BJT as shown in FIG. 2. In the figure the full line 51 shows the results without the surface electrode 9 connected to the emitter contact 1 and the dotted line 52 shows the results with the surface electrode 9 connected to the emitter contact 1. The surface passivation layer 8 in this particular example consists of a 20 nm thick dielectric surface passivation layer of silicon dioxide between SiC surface and the surface electrode 9. FIG. 5 shows that a peak current gain of 43 without a surface electrode and a peak current gain of 64.5 with a surface electrode 9 which has been connected to the emitter contact 1 to obtain a negative surface potential with respect to the bulk SiC inside the surface. The result in FIG. 5 indicates that about 50% increase of the peak current gain is possible by connecting the surface electrode 9 to the emitter contact 1. The connection of the surface electrode 9 to the emitter contact 1 is an example embodiment which can be implemented in the fabrication process without any additional transistor control electrode.

The higher current gain in FIG. 5 is caused by the negative surface electrode potential which leads to a lower electron concentration at the surface, and therefore a lower rate of surface recombination.

The simulation results in FIG. 5 provide theoretical support for the working principles of at least some embodiments. Since there is uncertainty in the simulation model parameters for traps at SiC surfaces, experimental results are also important to verify the benefits of at least some embodiments.

Figure 6:
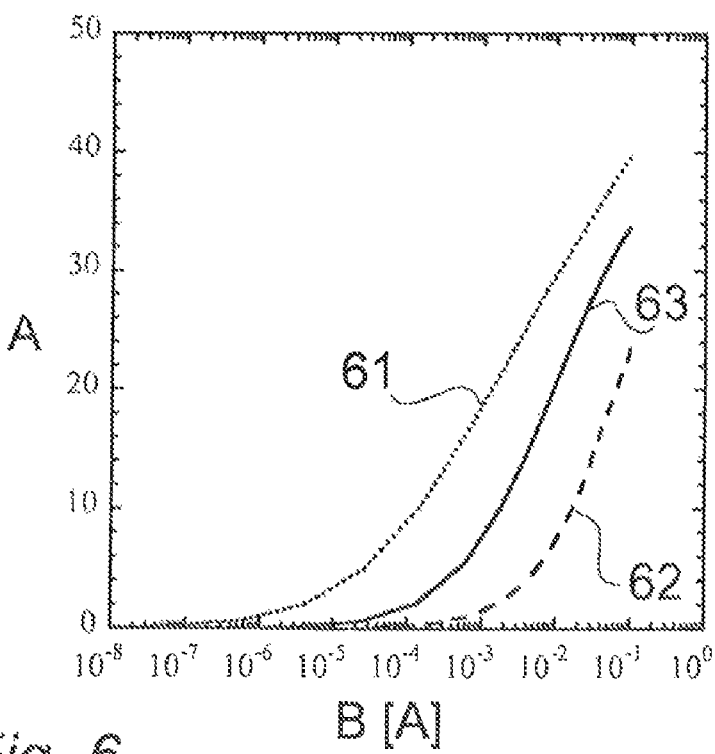
FIG. 6 is a graph showing measurements for a SiC BJT with a surface electrode as shown in FIG. 2 for the surface electrode potential of −40 V, 40 V and without electrical connection to the surface electrode.

FIG. 6 shows measurements of the current gain A for a fabricated SiC BJT with a surface electrode, as shown in FIG. 2. Results are shown for the cases of negative electric potential of −40 V at the surface electrode 9 in dotted line 61 and positive electric potential of +40 V at the surface electrode 9 in the dotted line 62 and without electrical connection to the surface electrode 9 in the full line 63. The measurements show that the peak current gain can be increased by about 18% from 33.7 to 39.7 by applying a negative potential of −40 V to the surface electrode.

The current gain A can also be reduced with about 30% by applying a positive potential to the surface electrode.

The current gain A increases with a negative surface potential because electrons are repelled and the decreasing surface electron concentration reduces the surface recombination.

The current gain A decreases with a positive surface potential because electrons are attracted and this increases the amount of surface recombination.

The measurement of FIG. 6 was performed for a SiC BJT with a much thicker passivation layer 8 than optimum and therefore the influence on the current gain is modest even for relatively high potentials applied to the surface electrode 9.

Nevertheless, the results in FIG. 6 clearly show an improved current gain A as a negative potential is applied to the surface electrode 9 with respect to the bulk SiC, thus providing experimental evidence that at least some embodiments are working in a desirable fashion.

It will be understood that embodiments are not restricted to the aforedescribed and illustrated exemplifying embodiments thereof and that modifications can be made within the scope of the inventive concept as illustrated in the accompanying Claims.

What is claimed is:

1. An apparatus, comprising:
   a silicon carbide material;
   a base contact disposed on a first portion of the silicon carbide material;
   an emitter contact disposed on a second portion of the silicon carbide material;
   a dielectric layer disposed on the silicon carbide material and disposed between the base contact and the emitter contact such that the dielectric layer does not overlap with the base contact;
   a surface electrode, including a conductive material, directly disposed on the dielectric layer; and
   a surface region of the silicon carbide material in contact with the dielectric layer.

2. The apparatus of claim 1, wherein the surface electrode is coupled to the emitter contact.

3. The apparatus of claim 1, wherein the surface electrode has a negative electrical potential based on an external negative potential with respect to a potential of the bulk portion of the silicon carbide material, the negative electrical potential of the surface region is based on an external negative potential with respect to a potential of the bulk portion of the silicon carbide material.

4. The apparatus of claim 1, wherein the surface electrode includes at least one of a metal or a doped poly-silicon.

5. The apparatus of claim 1, wherein the dielectric layer includes silicon dioxide.

6. The apparatus of claim 1, wherein the dielectric layer is a surface passivation layer.

7. The apparatus of claim 1, wherein the apparatus is a silicon carbide (SiC) bipolar junction transistor (BJT).

8. A silicon carbide (SIC) bipolar junction transistor (BJT), comprising:
   an emitter contact;
   a base contact;
   a bulk SiC portion;
   a surface passivation layer disposed on the bulk SiC portion such that the surface passivation layer does not overlap with the base contact;
   a surface region of the bulk SiC portion disposed between the emitter contact and the base contact; and
   a surface electrode directly disposed on the surface passivation layer, the surface electrode including an electrically conductive material, the surface electrode being configured to provide the surface region with a negative electrical surface potential with respect to a potential in the bulk SiC portion.

9. The SiC BJT of claim 8, wherein the surface electrode is coupled to the emitter contact.

10. The SiC BJT of claim 8, wherein the negative electric potential is provided in response to application of an external negative potential with respect to the potential of the bulk SiC portion.

11. The SiC BJT of claim 8, wherein the surface passivation layer includes silicon dioxide.

12. The SiC BJT of claim 8, wherein the surface passivation layer has a thickness between approximately 10 nm to 30 nm.

13. The SiC BJT of claim 8, wherein the surface electrode is directly coupled to the surface passivation layer.

14. The SiC BJT of claim 8, wherein the surface passivation layer has a thickness less than a thickness of at least one of the emitter contact or the base contact.

15. The SiC BJT of claim 8, wherein the surface electrode is in contact with less than all of the surface passivation layer.

16. A silicon carbide (SiC) bipolar junction transistor (BJT), comprising:
   an emitter contact;
   a base contact;
   a surface region;
   a dielectric layer in contact with the surface region such that the surface region is disposed between the emitter contact and the base contact and such that the dielectric layer is not disposed on the base contact, at least a portion of the surface region included in at least a portion of the SiC BJT configured to have a negative electrical surface potential with respect to a potential in a bulk portion of the SiC BJT; and
   a conductive layer directly disposed on the dielectric layer and configured to function as a surface electrode.

17. The SiC BJT of claim 16, wherein the dielectric layer is a surface passivation layer and the surface electrode is configured to receive a negative electrical potential with respect to the bulk portion of the SiC BJT.

18. The SiC BJT of claim 16, wherein the conductive layer includes at least one of a metal or a doped poly-silicon, and the dielectric layer includes silicon dioxide.

19. The SiC BJT of claim 16, wherein the conductive layer is configured to receive a negative electrical potential, with respect to the bulk portion of the SiC BJT, via a connection to the emitter.

20. The SiC BJT of claim 16, wherein the bulk portion of the SiC BJT and the dielectric layer define an interface including a negative electric charge.

21. The SiC BJT of claim 16, wherein the dielectric layer has a thickness on the order of 10 to 30 nm.

* * * * *

UNITED STATES PATENT AND TRADEMARK OFFICE
CERTIFICATE OF CORRECTION

PATENT NO. : 8,378,390 B2
APPLICATION NO. : 13/243056
DATED : February 19, 2013
INVENTOR(S) : Martin Domeij Page 1 of 1

It is certified that error appears in the above-identified patent and that said Letters Patent is hereby corrected as shown below:

In the Claims:

In column 7, line 4, in claim 8, delete "(SIC)" and insert -- (SiC) --, therefor.

Signed and Sealed this
Fourth Day of June, 2013

Teresa Stanek Rea
*Acting Director of the United States Patent and Trademark Office*